United States Patent [19]

Nagase et al.

[11] Patent Number: 5,260,901
[45] Date of Patent: Nov. 9, 1993

[54] OUTPUT CIRCUIT OF SEMICONDUCTOR MEMORY DEVICE

[75] Inventors: Kouichi Nagase; Yutaka Ikeda, both of Hyogo, Japan

[73] Assignee: Mitsubishi Denki Kabushiki Kaisha, Tokyo, Japan

[21] Appl. No.: 774,985

[22] Filed: Oct. 17, 1991

[30] Foreign Application Priority Data

Oct. 17, 1990 [JP] Japan .................. 2-279652

[51] Int. Cl.5 .............................. G11C 7/00
[52] U.S. Cl. .................. 365/189.01; 365/189.07; 365/189.09; 307/263; 307/517
[58] Field of Search ........... 365/189.01, 189.07, 365/189.09; 307/263, 555, 359, 355, 592, 18, 443, 264, 517

[56] References Cited

U.S. PATENT DOCUMENTS

| | | | |
|---|---|---|---|
| 4,719,369 | 2/1988 | Asano et al. | 307/263 |
| 4,779,013 | 10/1988 | Tanaka | 307/443 |
| 4,815,113 | 3/1989 | Ludwig et al. | 307/263 |
| 5,121,013 | 6/1992 | Chuang et al. | 307/263 |
| 5,142,495 | 8/1992 | Canepa | 365/189.09 |

FOREIGN PATENT DOCUMENTS 61-212116  9/1986  Japan .

64-20721  1/1989  Japan .

Primary Examiner—Eugene R. LaRoche
Assistant Examiner—Vu Le
Attorney, Agent, or Firm—Lowe, Price, LeBlanc & Becker

[57] ABSTRACT

An output circuit for providing data read from a memory cell is disclosed. When a power source is turned on, initial value data set in a register circuit is read and then latched in comparison circuits. The data latched in the comparison circuits are applied through NOR circuits to a plurality of transistors, so that the transistors corresponding in number to the initial value data are rendered conductive. An output signal is fed back from a common output terminal of the respective transistors to the comparison circuits, so that the respective comparison circuits compare between respective threshold values and the output signal. Thus, a determination is made as to whether the gradient of leading edges of waveforms of the output signal is sharp or gradual. If the gradient is gradual, the number of transistors becoming conductive increases, whereas if the gradient is sharp, the number of such transistors decreases. This makes it possible to suppress ringing included in the output signal waveforms independently of the magnitude of a load connected to the output terminal.

6 Claims, 6 Drawing Sheets

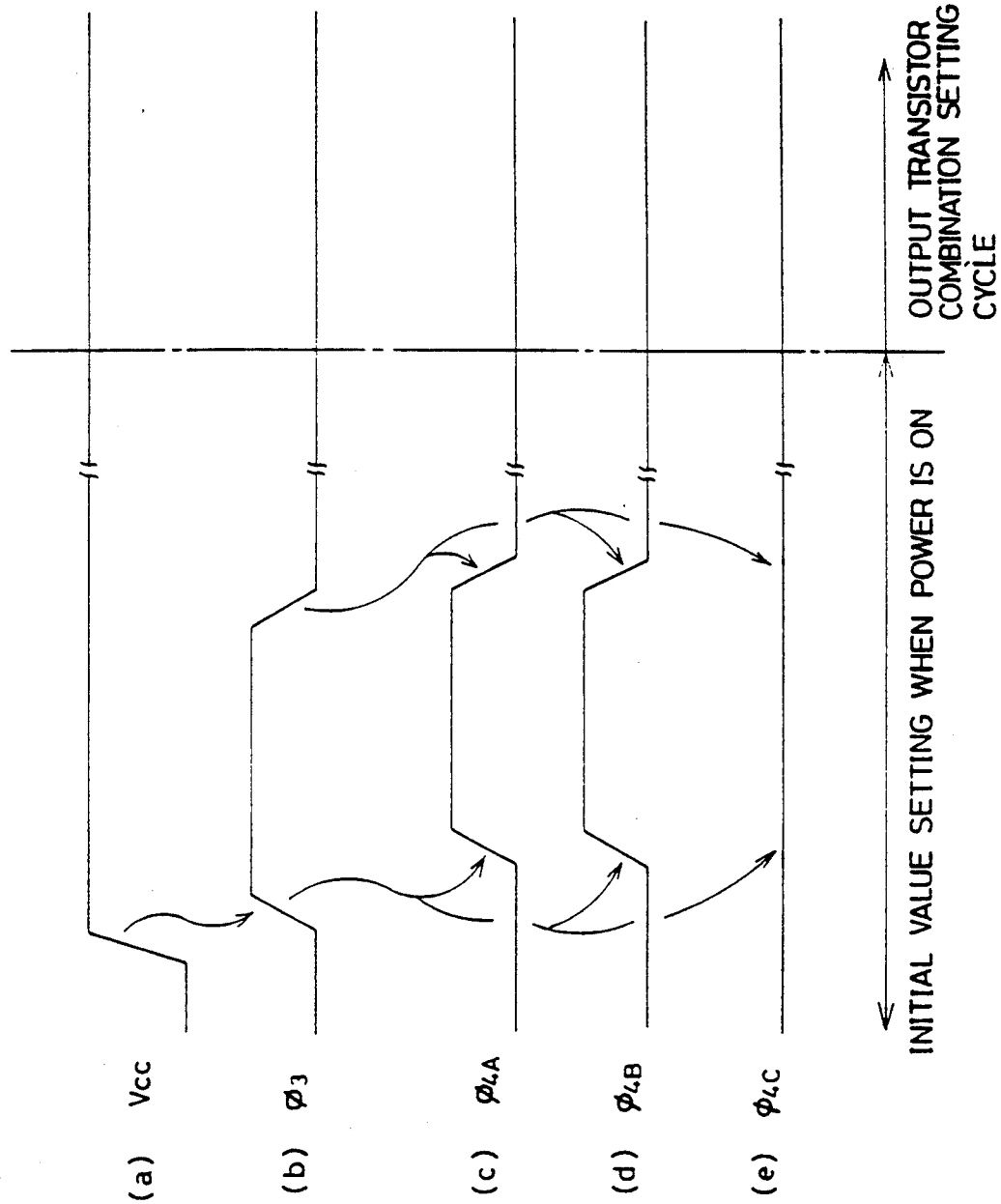

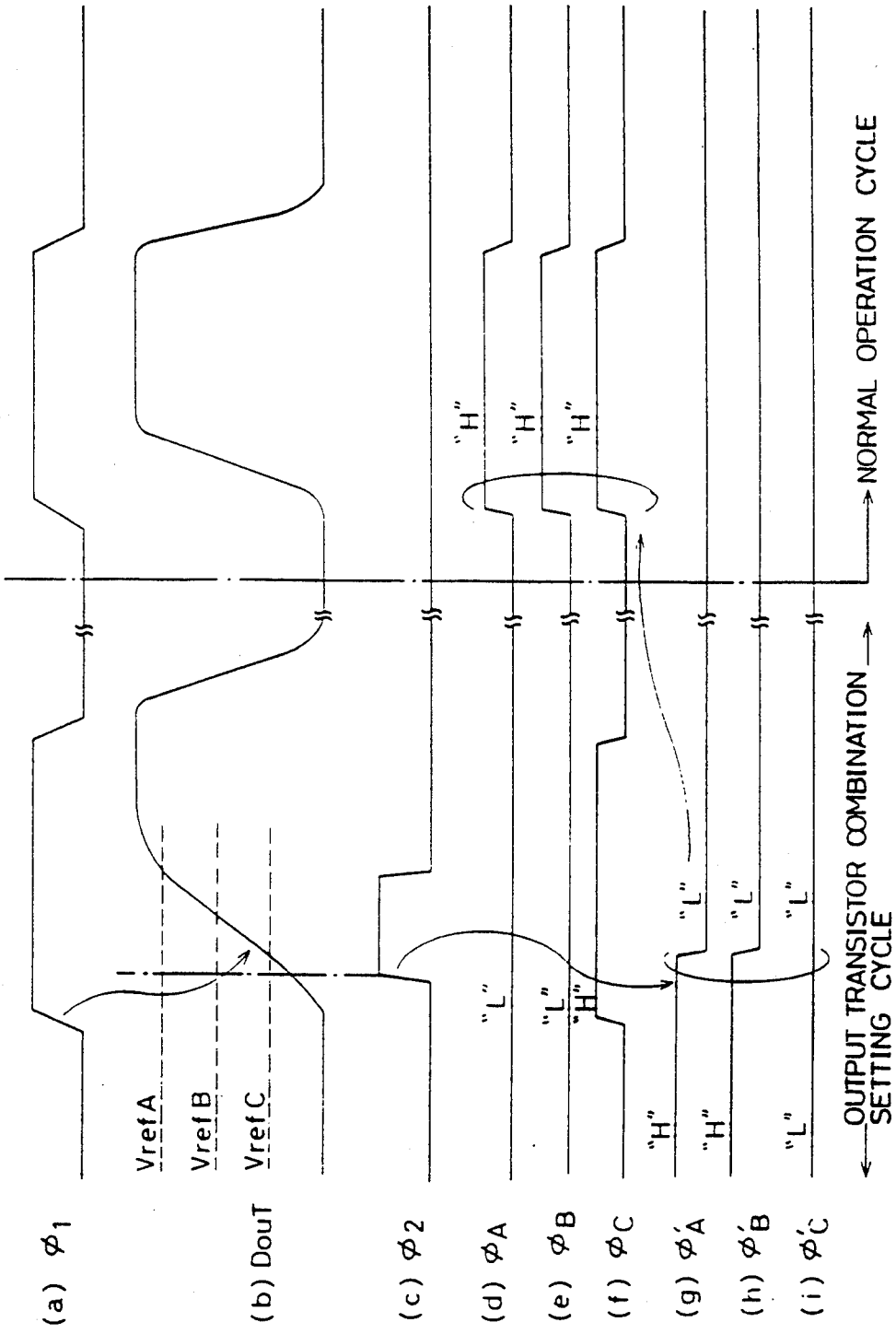

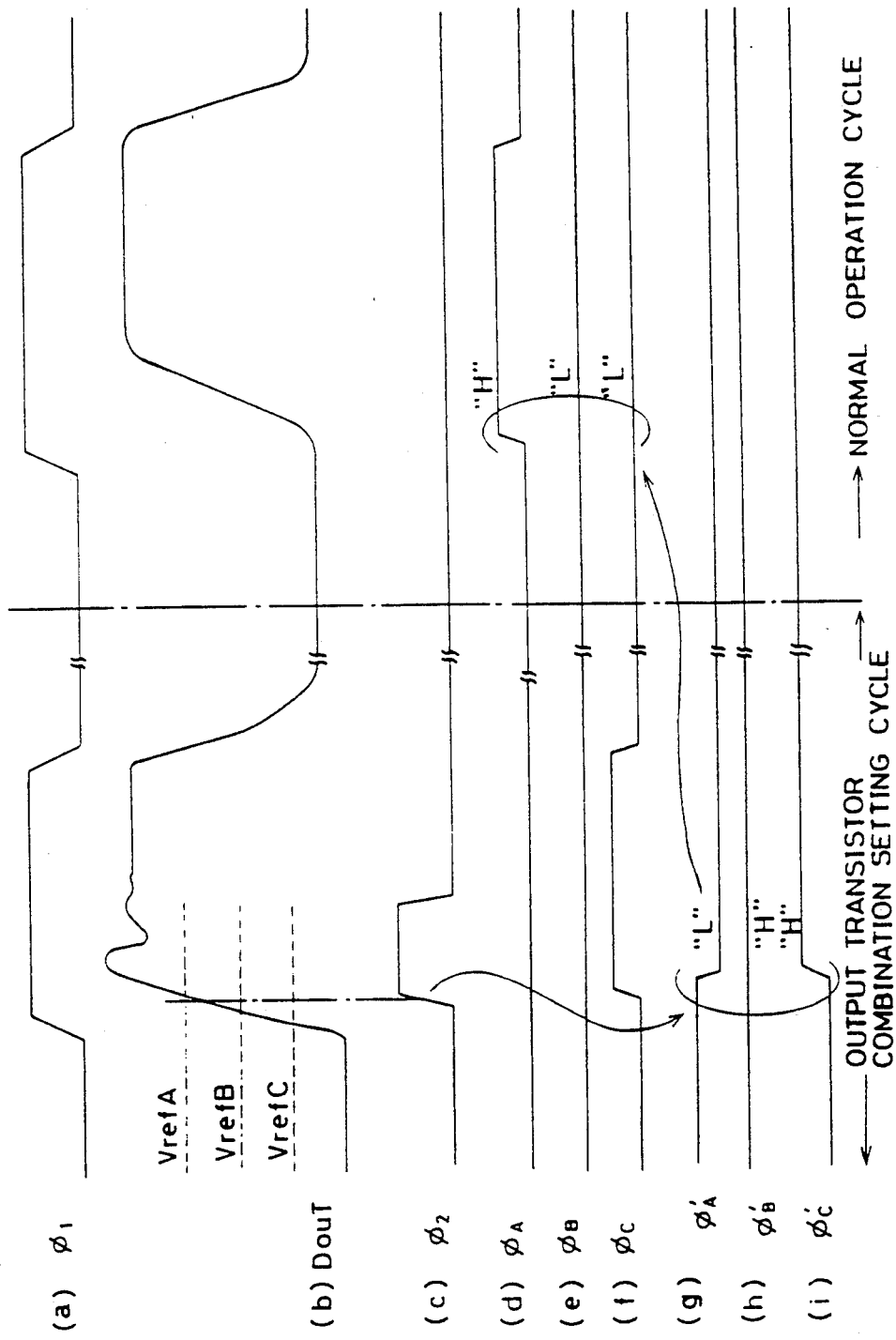

OUTPUT CIRCUIT OF SEMICONDUCTOR MEMORY DEVICE

BACKGROUND OF THE INVENTION

1. Field of the Invention

The present invention relates generally to output circuits of semiconductor memory devices and, more particularly, to an output circuit for providing data read from a storage element such as a dynamic random access memory (hereinafter referred to as DRAM) to an output terminal.

2. Description of the Background Art

FIG. 4 is a schematic block diagram showing an overall structure of a conventional DRAM. Referring to FIG. 4, address signals applied as an input to address input terminals $A_0$-$A_9$ are stored in an address buffer 1 and then applied to a column decoder 2 and a row decoder 3. Column decoder 2 specifies a column address of a memory cell 5, while row decoder 3 specifies a row address of memory cell 5. Memory cell 5 responds to a read/write specifying input to read data from an addressed memory cell or write data into the memory cell. More specifically, when data reading is specified, data is read from a corresponding address through a sense refresh amplifier and I/O controller 4 and is then output through a data output buffer 8. When data writing is specified, data provided as an input to a data input buffer 7 is written through sense refresh amplifier and I/O controller 4 into a specified address in memory cell 5. A clock generating circuit 6 responds to a column address strobe signal $\overline{CAS}$ and a row address strobe $\overline{RAS}$ to generate a clock signal required therein.

FIGS. 5 and 6 are electric circuit diagrams each showing one example of the data output buffer shown in FIG. 4. FIG. 7 is an input/output waveform diagram of the data output buffers shown in FIGS. 5 and 6.

In a data output buffer 8a shown in FIG. 5, n channel transistors 82 and 83 are connected in series between a power source +V and ground, and a signal $\phi_1$ determined on the basis of the data read from memory cell 5 shown in FIG. 4 is applied to an input of an inverter 81 and also a gate of n channel transistor 83. The signal inverted in inverter 81 is applied to a gate of n channel transistor 82. Data is output through an output terminal 84 from a connection point between a source of n channel transistor 82 and a drain of n channel transistor 83.

In a data output buffer 8b shown in FIG. 6, a p channel transistor 85 is provided in place of inverter 81 and n channel transistor 82 shown in FIG. 5.

In data output buffers 8a and 8b shown in FIGS. 5 and 6, a signal $\phi_1$ is determined on the basis of the data read from memory cell 5, and when this signal $\phi_1$ is input to data output buffers 8a and 8b, a signal Dout is output through output terminal 84. At this time, as shown in FIG. 7, the waveform of output signal Dout often becomes abnormal due to mismatching of impedance with an external circuit. Such a phenomenon is normally called a ringing.

As described above, in the conventional DRAM, the waveform abnormality (ringing) often occurs in output signal Dout, whereby troubles often occur in a system including such a DRAM. Especially, in recent years, there is a tendency that the number of output signals increases as $1 \rightarrow 4 \rightarrow 8 \rightarrow 16 \ldots$ with an increase in storage capacity and that allowable margins decrease with an increase in operation speed of the system. Thus, the ringing has become a great problem.

SUMMARY OF THE INVENTION

A principal object of the present invention is therefore to provide an output circuit of a semiconductor memory device in which ringing can be suppressed.

Briefly, the present invention is directed to an output circuit of a semiconductor memory device for providing data read from a storage element to an output terminal. In this output circuit, outputs of a plurality of switching circuitry are commonly connected to an output terminal; the magnitude of a load connected to this output terminal is determined on the basis of the gradient of leading edges of data provided to the output terminal; and the switching circuitry corresponding in number to the determined magnitude of the load are rendered conductive in response to application of the data read from the storage element.

Accordingly, in accordance with the present invention, if the number of the switching circuitry which are rendered conductive on the basis of the magnitude of the load is varied, a rise time and a fall time of an output waveform can be maintained at a constant time on the basis of impedance of an external load connected to the output terminal. Thus, such abnormality of output signals as ringing can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a timing chart provided upon initial value setting;

FIG. 3A is a timing chart provided in the case where a load is large and an output signal Dout is distorted;

FIG. 3B is a timing chart provided in the case where a load is small and an output signal Dout rises early, so that ringing is produced;

DESCRIPTION OF THE PREFERRED EMBODIMENT

Figure 1:
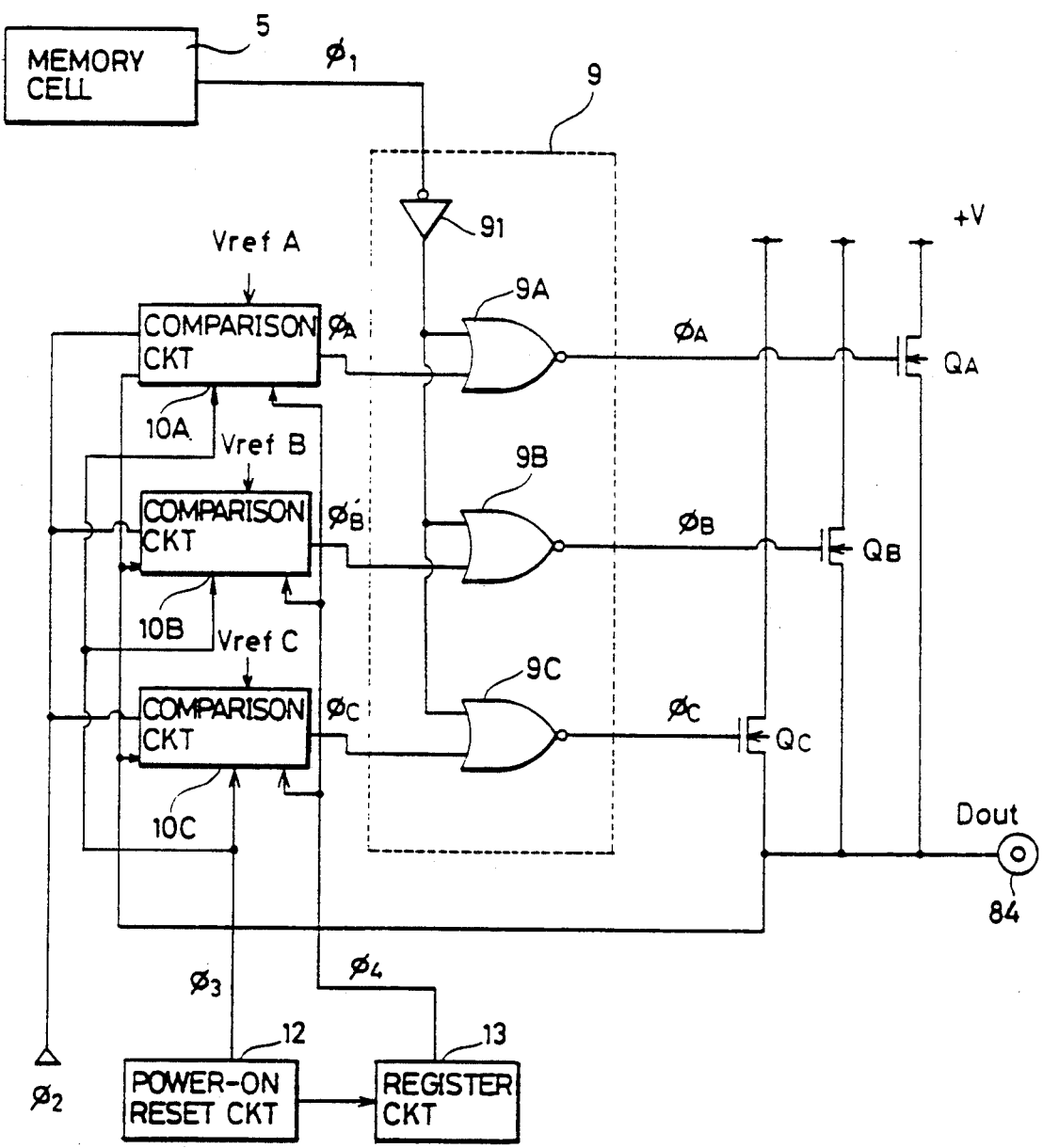
FIG. 1 is an electric circuit diagram of one embodiment of the present invention.
Figure 4:
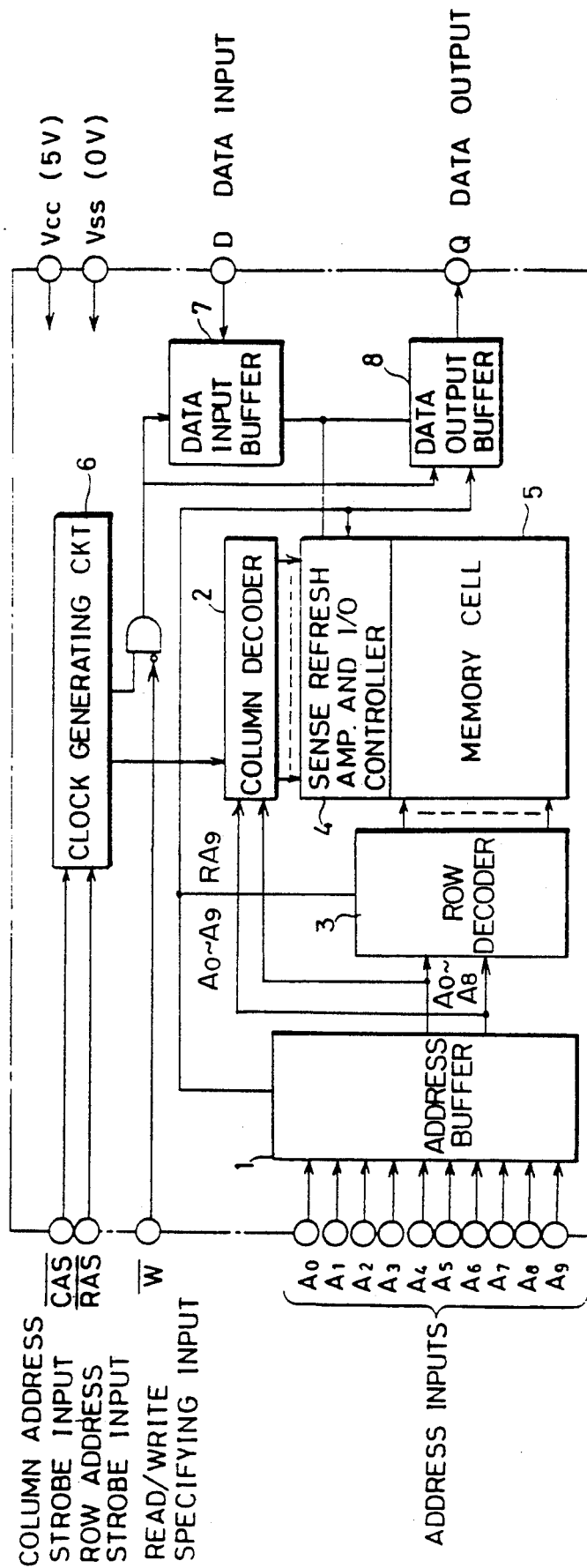
FIG. 4 is a schematic block diagram of an overall structure of a conventional DRAM to which the present invention is applied.
Figure 5:
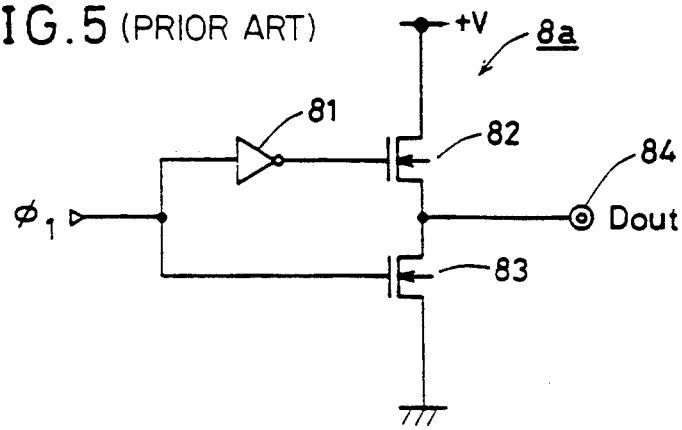
FIGS. 5 and 6 are circuit diagrams of conventional data output buffers.
Figure 6:
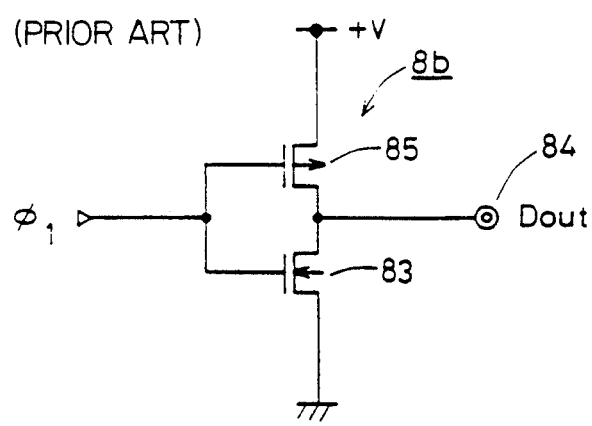
Figure 7:
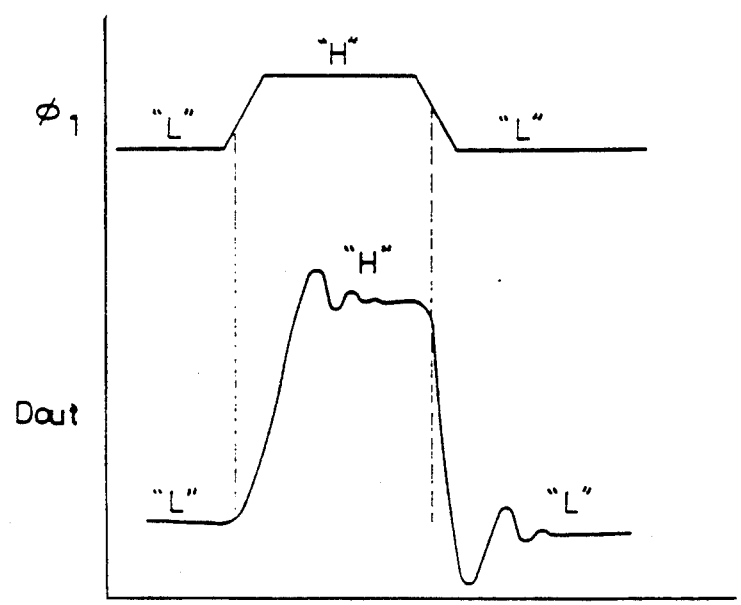
FIG. 7 is an input/output waveform diagram of a conventional data output buffer.

An output circuit shown in FIG. 1 is incorporated in data output buffer 8 shown in FIG. 4. Referring to FIG. 1, a signal $\phi_1$ determined on the basis of data read from a memory cell 5 is applied to a control circuit 9. Control circuit 9 includes an inverter 91 and NOR gates $9_A$, $9_B$ and $9_C$. Signal $\phi_1$ is inverted in inverter 91 and then applied to one input terminal of each of NOR gates $9_A$, $9_B$ and $9_C$. Respective outputs $\phi_A$-$\phi_C$ of NOR gates $9_A$, $9_B$ and $9_C$ are applied to respective gates of n channel MOS transistors $Q_A$, $Q_B$ and $Q_C$. Respective drains of n channel MOS transistors $Q_A$, $Q_B$ and $Q_C$ are connected to a power source +V, and their respective sources are connected to an output terminal 84. An output signal Dout output through output terminal 84 is applied to comparison circuits $10_A$, $10_B$ and $10_C$. A set signal $\phi_2$ output from clock generating circuit 6 shown in FIG. 4 is applied to comparison circuits $10_A$, $10_B$ and $10_C$. Also, comparison circuits $10_A$, $10_B$ and $10_C$ are supplied with reference voltages $Vref_A$, $Vref_B$ and $Vref_C$ of different levels, respectively. Comparison circuits $10_A$, $10_B$ and $10_C$ make a comparison between gradient portions of leading edges of signal $\phi_1$ and reference voltages $Vref_A$–$Vref_C$, respectively, so as to determine the magnitude of a load connected to output terminal 84 on the basis of the degree of the gradient. Respective outputs $\phi_A'$, $\phi_B'$ and $\phi_C'$ of comparison circuits $10_A$, $10_B$ and $10_C$ are applied to respective other input terminals of NOR gates $9_A$, $9_B$ and $9_C$.

A power-on reset circuit 12 detects the rise of a supply voltage Vcc and applies an initial value set signal $\phi_3$ to each of comparison circuits $10_A$, $10_B$ and $10_C$ and also to a register circuit 13. Register circuit 13 stores in advance initial values for comparison circuits $10_A$, $10_B$ and $10_C$. Register circuit 13 responds to initial value set signal $\phi_3$ applied from power-on reset circuit 12 to apply initial value signals $\phi_{4A}$, $\phi_{4B}$ and $\phi_{4C}$ to comparison circuits $10_A$, $10_B$ and $10_C$, respectively. Comparison circuits $10_A$, $10_B$ and $10_C$ respond to initial value set signal $\phi_3$ to apply initial value signals $\phi_{4A}$, $\phi_{4B}$ and $\phi_{4C}$ to NOR gates $9_A$, $9_B$ and $9_C$, respectively.

FIG. 2 is a timing chart provided upon initial value setting according to one embodiment of the present invention; FIG. 3A is a timing chart provided when a load is large; and FIG. 3B is a timing chart provided when the load is small.

A detailed operation of one embodiment of the present invention will now be described with reference to FIGS. 1 to 3B. A description will first be made on an operation of setting an initial value with reference to FIG. 2. With a power source turned on, if power-on reset circuit 12 detects the rise of supply voltage Vcc as shown in FIG. 2(a), then circuit 12 generates an initial value set signal $\phi_3$ of a logic high level to apply the same to comparison circuits $10_A$, $10_B$ and $10_C$ and register circuit 13 as shown in FIG. 2(b). Register circuit 13 responds to initial value set signal $\phi_3$ to individually apply respective initial value data $\phi_{4A}$, $\phi_{4B}$ and $\phi_{4C}$ shown in FIG. 2(c), (d) and (e) to respective comparison circuits $10_A$, $10_B$ and $10_C$. Comparison circuits $10_A$, $10_B$ and $10_C$ respond to initial value set signal $\phi_3$ to set initial value data $\phi_{4A}$, $\phi_{4B}$ and $\phi_{4C}$. Since these initial value data $\phi_{4A}$, $\phi_{4B}$ and $\phi_{4C}$ are in a logic high level ("H"), a logic high level ("H") and a logic low level ("L"), respectively, respective outputs $\phi_A'$, $\phi_B'$ and $\phi_C'$ of comparison circuits $10_A$, $10_B$ and $10_C$ attain respective logic levels of "H", "H" and "L" as shown in FIG. 3A(g), (h) and (i). NOR gates $9_A$, $9_B$ and $9_C$ make respective signals $\phi_A$, $\phi_B$ and $\phi_C$ attain respective logic levels of "L", "L" and "H" as shown in FIG. 3A(d), (e) and (f). As a result, transistor $Q_C$ is rendered conductive. At this time, if the load connected to output terminal 84 is large, the rise of output signal Dout becomes dull as shown in FIG. 3A(b).

Output signal Dout is fed back to comparison circuits $10_A$, $10_B$ and $10_C$. Then, if supplied with a signal $\phi_2$ shown in FIG. 3A(c), comparison circuits $9_A$, $9_B$ and $9_C$ make a comparison between output signal Dout and reference voltages $Vref_A$, $Vref_B$ and $Vref_C$, respectively. Since output signal Dout is in a lower level than reference voltages $Vref_A$, $Vref_B$ and $Vref_C$, comparison circuits $9_A$, $9_B$ and $9_C$ cause signals $\phi_A'$, $\phi_B'$ and $\phi_C'$ to attain an "L" level.

In a normal operation cycle, if a logic high level signal $\phi_1$ is applied as shown in FIG. 3A(a), then this signal $\phi_1$ is inverted by inverter 91, to attain an "L" level. NOR gates $9_A$, $9_B$ and $9_C$ cause signals $\phi_A$, $\phi_B$ and $\phi_C$ to attain an "H" level as shown in FIG. 3A(d), (e) and (f). Accordingly, transistors $Q_A$, $Q_B$ and $Q_C$ are rendered conductive. As a result, output signal Dout rises sharply as shown in FIG. 3A(b).

Conversely, if the load connected to output terminal 84 is small, output signal Dout rises sharply as shown in FIG. 3B(b), so that ringing is produced. At this time, comparison circuits $10_A$, $10_B$ and $10_C$ compare between reference voltages $Vref_A$, $Vref_B$ and $Vref_C$ and output signal Dout, respectively, and thus determine the relationship of $Vref_C < Vref_B < Dout < Vref_A$. Accordingly, comparison circuits $10_A$, $10_B$ and $10_C$ cause signals $\phi_A'$, $\phi_B'$ and $\phi_C'$ to attain a logic low level ("L"), a logic high level ("H") and a logic high level ("H"), respectively, as shown in FIG. 3B(g), (h) and (i). When supplied with a logic high level signal $\phi_1$, in a normal operation cycle, NOR gates $9_A$, $9_B$ and $9_C$ cause signals $\phi_A$, $\phi_B$ and $\phi_C$ to attain a logic high level ("H"), a logic low level ("L") and a logic low level ("L"), respectively, as shown in FIG. 3B(d), (e) and (f). As a result, only transistor $Q_A$ is rendered conductive, so that the gradient of output signal Dout becomes gradual, resulting in elimination of ringing.

While three n channel MOS transistors $Q_A$–$Q_C$ are used as transistors for outputting output signal Dout in the foregoing embodiment of FIG. 1, the number of these transistors is not limited to this, and two or more transistors may be employed and also p channel MOS transistors and n channel MOS transistors may be employed together. Alternatively, the transistors for use are not limited to MOS transistors, and bipolar transistors may be employed.

While comparison circuits $10_A$, $10_B$ and $10_C$ are supplied with external reference voltages $Vref_A$, $Vref_B$ and $Vref_C$, respectively in the foregoing embodiment, any voltages, the level of which can be determined in arbitrary time, may be applied.

In addition, while the countermeasure for ringing, which is taken when output signal Dout changes to a logic high level, has been described in the foregoing embodiment, the same ringing countermeasure is applicable to the case where output signal Dout changes to a logic low level.

As has been described heretofore, according to the embodiment of the present invention, since the number of transistors becoming conductive varies dependently on the magnitude of a load, a rise/fall time of an output waveform can be kept at a constant time on the basis of impedance of an external load connected to an output terminal, thereby enabling suppression of such abnormality of an output signal as ringing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit of a semiconductor memory device for providing data read from a storage element to an output terminal, comprising:
    a plurality of switching means having respective outputs commonly connected to said output terminal;

determining means for determining the magnitude of a load of said output terminal on the basis of the gradient of leading edges of waveforms of the data provided to said output terminal; and control means responsive to application of the data read from said storage element for rendering ones of said plurality of switching means, corresponding in number to the magnitude of the load determined by said determining means, conductive; wherein said determining means comprises a plurality of comparison means each provided corresponding to said plurality of switching means for comparing between respective reference voltages and respective levels of leading edges of data waveforms output from said output terminal and, if said respective levels of said leading edges exceed corresponding reference voltages, outputting a signal; and said control means comprises gate means each provided corresponding to said plurality of switching means and responsive to application of the data read from said storage element for rendering corresponding switching means conductive if corresponding comparison means output a signal.

2. The output circuit according to claim 1, further comprising:

register means for storing initial value data to be applied to each said comparison means; and means responsive to turning on of a power source for setting the initial value data stored in said register means; and wherein each said gate means comprises means responsive to the initial value data set in said comparison means for controlling corresponding switching means.

3. A method for controlling an output signal of a storage element in a semiconductor memory device using gate elements coupled to an output of the storage element, said method comprising the steps of:

determining magnitude of a load coupled to the storage element by comparing the gradient of a leading edge of the output signal with a reference value to form a gating signal, and applying the gating signal and the output of the storage element to at least one of the gate elements to modify the output signal in accordance with the magnitude of the load.

4. The method of claim 3, wherein said step of determining comprises comparing the gradient of the leading edge of the output signal with a plurality of various reference signals to form a plurality of components of the gating signal.

5. The method of claim 4, wherein said step of applying comprises supplying a plurality of the gating elements with the plurality of components.

6. The method of claim 5, wherein the number of the gating elements activated by the gating signals depends from the magnitude of the load.

* * * * *